(12) United States Patent
Gurusamy et al.

(10) Patent No.: US 9,662,762 B2
(45) Date of Patent: May 30, 2017

(54) MODIFYING SUBSTRATE THICKNESS PROFILES

(71) Applicant: Applied Materials, Inc., Santa Clara, CA (US)

(72) Inventors: Jay Gurusamy, Santa Clara, CA (US); Hung Chih Chen, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 57 days.

(21) Appl. No.: 14/334,948

(22) Filed: Jul. 18, 2014

(65) Prior Publication Data

US 2016/0016279 A1 Jan. 21, 2016

(51) Int. Cl.
| | | |
|---|---|---|
| *B24B 7/22* | (2006.01) | |
| *B24B 37/34* | (2012.01) | |
| *B24B 37/04* | (2012.01) | |
| *H01L 21/306* | (2006.01) | |

(52) U.S. Cl.
CPC ............ *B24B 37/042* (2013.01); *B24B 37/34* (2013.01); *H01L 21/30625* (2013.01)

(58) Field of Classification Search
CPC ...................................................... B24B 7/22
USPC ............................ 451/504, 505, 41, 287–290
See application file for complete search history.

(56) References Cited

U.S. PATENT DOCUMENTS

| | | | |
|---|---|---|---|
| 5,558,563 A * | 9/1996 | Cote ....................... | B24B 37/26 451/278 |
| 5,800,248 A | 9/1998 | Pant et al. | |
| 5,938,504 A | 8/1999 | Talieh | |
| 6,036,583 A | 3/2000 | Perlov et al. | |
| 6,152,806 A | 11/2000 | Nystrom | |
| 6,241,585 B1 | 6/2001 | White | |
| 6,267,659 B1 * | 7/2001 | Chen ....................... | B24B 37/22 451/287 |
| 6,764,387 B1 | 7/2004 | Chen | |
| 6,913,518 B2 * | 7/2005 | Chen ....................... | B24B 37/16 451/41 |
| 7,276,743 B2 | 10/2007 | Manens et al. | |
| 8,858,300 B2 * | 10/2014 | Cellier ................... | B24B 37/16 451/288 |
| 2010/0099340 A1 | 4/2010 | Chen | |
| 2011/0239876 A1 | 10/2011 | Brown | |
| 2012/0171933 A1 | 7/2012 | Chen | |
| 2014/0113533 A1 | 4/2014 | Fung et al. | |
| 2014/0141694 A1 | 5/2014 | Zhang et al. | |

FOREIGN PATENT DOCUMENTS

WO      2012-082115      6/2012

OTHER PUBLICATIONS

International Search Report in International Application No. PCT/US2015/040064, dated Oct. 20, 2015, 11 pages.

\* cited by examiner

*Primary Examiner* — Robert Rose
(74) *Attorney, Agent, or Firm* — Fish & Richardson P.C.

(57) ABSTRACT

A polishing system include a support to hold a substrate having a substrate surface to be polished, a carrier to hold a polishing pad in contact with the substrate surface, and a pressure applicator to apply pressure at a selected region of a back surface of the polishing pad. The back surface is opposite to the polishing surface. The pressure applicator includes an actuator and a body configured to be moved by the actuator into and out of contact with the selected region of the back surface of the polishing pad.

12 Claims, 5 Drawing Sheets

MODIFYING SUBSTRATE THICKNESS PROFILES

TECHNICAL FIELD

The present disclosure relates to chemical mechanical polishing and more specifically to modifying substrate thickness profiles.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the back side substrate to push the front side of the substrate against the polishing pad. Polishing slurry with abrasive particles is typically supplied to the surface of the polishing pad.

SUMMARY

In commercially available polishing systems, the substrate receives a backside pressure, which pushes the exposed surface of the substrate against the rotating polishing pad. However, the substrate has a relatively high stiffness, causing pressure on the back side of the substrate to be dispersed to a larger area on the front surface of the substrate. For example, a pressure applied to one mm diameter point on the backside of the substrate can be dispersed to cover a zone having a diameter, e.g., of 30 mm. As a result, it is difficult to finely control the distribution of the pressure on the exposed surface of the substrate using the backside pressure. Correcting undesirable peak(s) or valley (s) located within a small zone on the exposed surface may become difficult. A technique to address this problem is to control the pressure of the polishing pad against the substrate.

In one aspect, a polishing system includes a support to hold a substrate having a substrate surface to be polished, a carrier to hold a polishing pad in contact with the substrate surface, and a pressure applicator to apply pressure at a selected region of a back surface of the polishing pad. The back surface is opposite to the polishing surface. The pressure applicator includes an actuator and a body configured to be moved by the actuator into and out of contact with the selected region of the back surface of the polishing pad.

In another aspect, a polishing tool includes a bulk polishing station, a modification station, and a transfer mechanism configured to transfer the substrate between the bulk polishing station and the modification station. The bulk polishing station includes a rotatable platen to support a polishing article, and a carrier head to hold a substrate with a surface of the substrate in contact with a polishing surface of the polishing article, the carrier head having one or more controllable zones. The modification station includes a support to hold the substrate having a to be polished, a carrier to hold a polishing pad in contact with the substrate surface, and a pressure applicator to apply pressure at a selected region of a back surface of the polishing pad, the back surface being opposite to the polishing surface, wherein the pressure applicator includes an actuator and a body configured to be moved by the actuator into and out of contact with the selected region of the back surface of the polishing pad.

In another aspect, a method of polishing includes bringing a surface of a substrate into contact with a polishing surface of a polishing pad, the surface of the substrate comprising one or more underpolished regions, the polishing pad spanning the surface of the substrate, applying pressure to one or more selected regions of a back surface of the polishing pad substantially without applying pressure to a remainder of the back surface of the polishing surface, the back surface being opposite to the polishing surface, the one or more selected regions of the back surface corresponding to the one or more underpolished regions, and generating relative motion between the substrate and polishing pad to cause polishing of the one or more underpolished regions.

In another aspect, a polishing system includes a support to hold a substrate having a substrate surface to be polished, a conditioning system for conditioning a polishing pad, the conditioning system comprising one or more conditioning heads, a movable support structure, and a carrier to hold a polishing pad. The carrier is suspended from the movable support structure, and the support structure is configured to move the carrier between the support to hold the substrate and the conditioning system.

Implementations may include one or more of the following advantages. Localized pressure can be applied from the front side of a substrate surface being polished without passing through the substrate. Pressure distribution on the substrate surface can be finely controlled without dispersion through the substrate so that localized thickness modification can be precisely performed. The localized pressure can be applied by pressure control pads that have selected sizes and shapes corresponding to the size and/or shape of the region on the substrate that needs the thickness modification. The pressure control pads can be movable relative to the substrate to modify the substrate thickness at multiple locations. The pressure dispersion can be further reduced by using a polishing pad that is sized and/or shaped based on the size and/or shape of the region on the substrate that needs the thickness modification. Alternatively or in addition, one or more flexible rings can be used to apply localized pressure to the polishing pad and the substrate to finely modify the thickness of the substrate at desired locations. The thickness modification can be performed at a modification station that additionally integrally includes a polishing pad conditioning system. Multi-cross processing can be performed in which one or more substrates are having thickness modified while one or more polishing pads are being conditioned.

The details of one or more embodiments of the invention are set forth in the accompanying drawings and the description below. Other features, objects, and advantages of the invention will be apparent from the description and drawings, and from the claims.

DETAILED DESCRIPTION

Overview

When a surface of a substrate is polished using a chemical mechanical polishing process, sometimes substrate material(s) at different locations of the surface is removed at different rates. For example, substrate material(s) in a surface region near the edge of the substrate can be removed at a higher rate than that in a surface region near a center of the substrate. In another example, the polished surface may contain undesirable under-polished peaks or over-polished valleys in small, localized zones, e.g., zones having a linear dimension of 10 mm or less. Such peaks or valleys may be caused by imperfections in polishing process or polishing apparatus.

For simplicity of the discussion, a polishing process that substantially planarizes the surface of the substrate, i.e., substantially removes step height differences caused by the underlying pattern, and removes a bulk part of the material that is intended to be removed, is referred to as bulk polishing.

The chemical mechanical polishing processes of this disclosure includes one or more additional steps that modify thickness profiles of substrates before, during, and/or after the bulk polishing of the substrates. In these processes, instead of or in addition to a backside pressure, the surface being polished receives a pressure from a front side without having the pressure pass through the substrate. The front-side pressure is applied through the polishing pad and does not substantially disperse through the polishing pad. By finely controlling the area and the amount of the pressure applied to the polishing pad, the pressure reached at the surface being polished is finely controlled. The modification to the thickness profile of the substrate can be highly localized and adjustable and can be performed to different zones, e.g., radial zones, of the substrate surface. The localized pressure can be applied using one or more pressure control pads and/or one or more flexible rings. In some implementations, a backside pressure and a front side pressure can be used in combination.

The thickness modification can be performed mechanically, chemically, or chemical mechanically. In some implementations, the one or more additional steps include chemical mechanical polishing steps that are similar to those used in the bulk polishing, except that the pressure distribution on the surface being polished is finely controlled such that the chemical mechanical polishing only occurs at desired, localized zones of the surface.

The one or more steps can also include conditioning the polishing pad used in thickness modification. The conditioning can be conveniently performed at the same station at which the thickness modification process is performed. Sometimes the conditioning is only done at selected locations of the polishing pad which have been used for modifying thicknesses of a substrate at corresponding locations.

Example Polishing Systems

Figure 1:
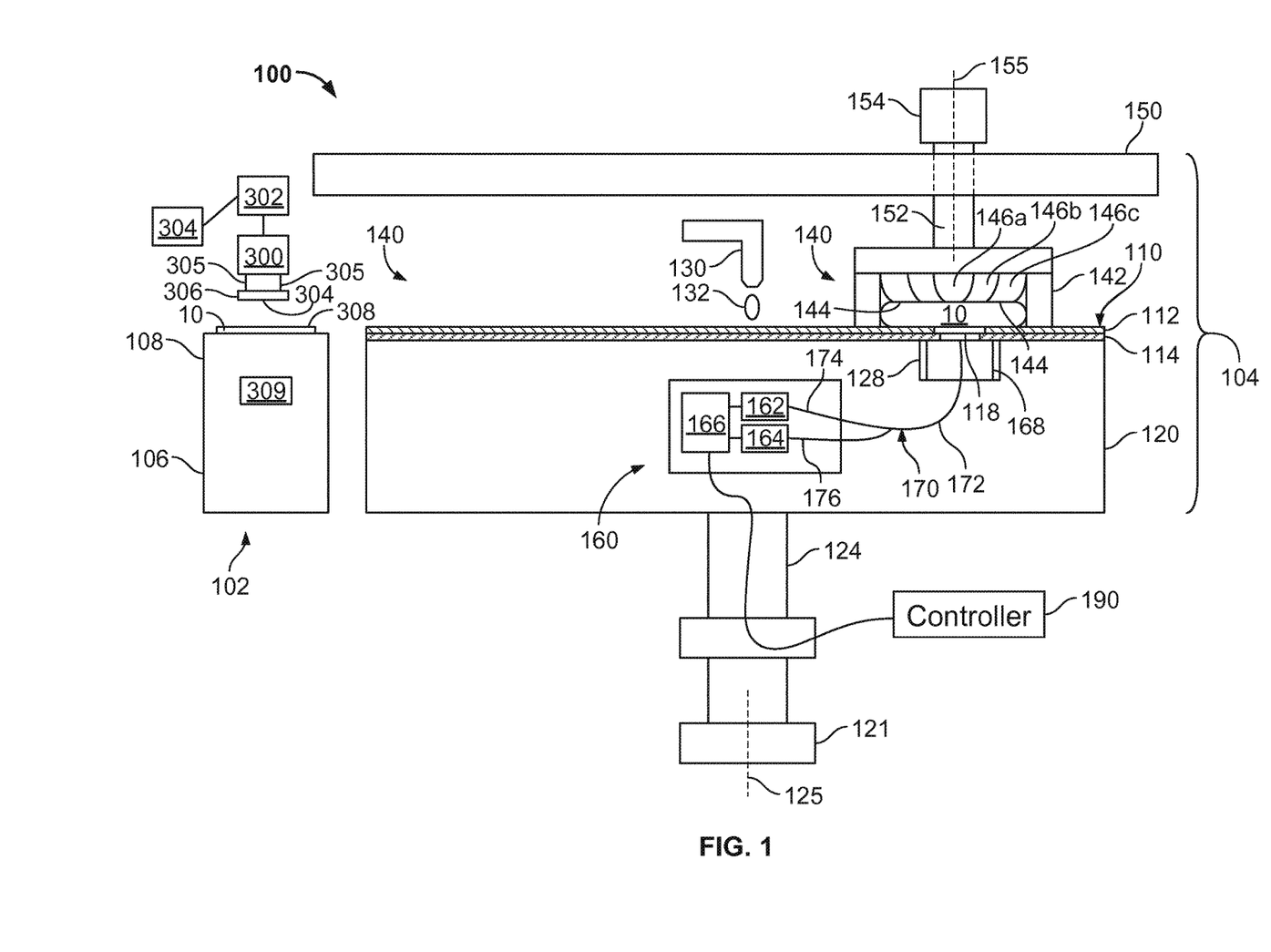
FIG. 1 illustrates a schematic cross-sectional view of an example of a polishing system.

FIG. 1 illustrates an example of a polishing system 100 that includes a bulk polishing apparatus 104 and a modification station 102. A substrate 10 to be polished can be transferred between the modification station 102 and the bulk polishing apparatus 104 for thickness modification and bulk polishing. For example, the substrate can be directed to the modification station 102 before, in the midst of, or after the bulk polishing of the substrate 10 at the polishing apparatus 104. The transfer of the substrate 10 can be made using a mechanism, e.g., a load/unload assembly or a robotic arm, between the station 102 and the apparatus 104. In some implementations, the modification station 102 is a stand-alone system. In this case, the modification station 102 can be located in the vicinity of the bulk polishing apparatus 104, e.g., in the same processing room. Although not shown in the figure, the station 102 can also be integrated in the apparatus 104.

The Bulk Polishing Apparatus

The polishing apparatus 104 includes one or more carrier heads 140 (only one shown). Each carrier head 140 is operable to hold a substrate 10, such as a wafer, against the polishing pad 110. Each carrier head 140 can have independent control of the polishing parameters, for example pressure, associated with each respective substrate. Each carrier head 140 includes a retaining ring 142 to hold the substrate 10 in position on the polishing pad 110 and below a flexible membrane 144.

Each carrier head 140 can optionally include a plurality of independently controllable pressurizable chambers defined by the membrane, e.g., three chambers 146a-146c, which can apply independently controllable pressurizes to associated zones on the flexible membrane 144 and thus on the substrate 10.

Each carrier head 140 is suspended from a support structure 150, e.g., a carousel or a track, and is connected by a drive shaft 152 to a carrier head rotation motor 154 so that the carrier head can rotate about an axis 155. Optionally each carrier head 140 can oscillate laterally, e.g., on sliders on the carousel 150; by rotational oscillation of the carousel itself, or by motion of a carriage that supports the carrier head 140 along the track.

The platen 120 included in the polishing apparatus 104 is a rotatable disk-shaped platen on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 102 can include a port 130 to dispense polishing liquid 132, such as a slurry, onto the polishing pad 110 to the pad. The polishing apparatus can also include a polishing pad conditioner to abrade the polishing pad 110 to maintain the polishing pad 110 in a consistent abrasive state.

In operation, the platen is rotated about its central axis 125, and each carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently. Thus, the number of carrier head assemblies adapted to hold substrates for a simultaneous polishing process can be based, at least in part, on the surface area of the polishing pad 110.

In some implementations, the polishing apparatus includes an in-situ monitoring system 160. The in-situ monitoring system can be an optical monitoring system, e.g., a spectrographic monitoring system, which can be used to measure a spectrum of reflected light from a substrate undergoing polishing. An optical access through the polishing pad is provided by including an aperture (i.e., a hole that runs through the pad) or a solid window 118. The in-situ monitoring system can alternatively or in addition include an eddy current monitoring system.

In some implementation, the optical monitoring system 160 is an in-sequence optical monitoring system having a probe (not shown) positioned between two polishing apparatuses or between a polishing apparatus and a transfer station. The monitoring system 160 can continuously or periodically monitor one or more features of the zones of the substrate during polishing. For example, one feature is a thickness of each zone of the substrate.

In either the in-situ or in-sequence embodiments, the optical monitoring system 160 can include a light source 162, a light detector 164, and circuitry 166 for sending and receiving signals between a remote controller 190, e.g., a computer, and the light source 162 and light detector 164. One or more optical fibers 170 can be used to transmit the light from the light source 162 to the optical access in the polishing pad, and to transmit light reflected from the substrate 10 to the detector 164.

The Modification Station

The modification station 102 includes a support structure 106 that provides a surface 108 to receive a substrate 10. The substrate 10 may also be secured to the support structure 106, e.g., by vacuum chucking or clamps.

A fine control polishing head 300 can be controlled by a controller 302 to selectively modify thicknesses at different locations of a surface 308 of the substrate 10. The surface 308 of the substrate 10 can be brought in contact with a polishing surface 304 of a polishing pad 306, and slurry can be supplied between the two surfaces 304, 306. During polishing, the pressure applied by discrete regions of the polishing pad 306 is controlled by pressure applicator(s) 305. Thus, the fine control polishing head 300 can apply pressure at selected locations of the polishing pad 306 to modify the thicknesses of the substrate 10 at localized regions. For example, the regions on the substrate can have a lateral size (parallel to the surface) of about 1-10 mm, e.g., 5 mm. The thickness modification can remove materials in these regions by an amount in the order of nanometers, e.g., 2-100 nm, 10-100 nm or 50-100 nm.

The controller 302 can store a pre-determined thickness profile for the substrate 10 and can control the modification of the substrate thickness based on the stored profile. For example, using the stored profile and an actual thickness profile or predicted thickness profile of the substrate 10, the fine control polishing head 300 can be instructed to modify the thickness of the substrate to reach the stored profile. The actual thickness profile of a substrate to be modified can be obtained using dry metrology or wet measurement before the modification process starts. In some implementations, the controller 302 stores data, e.g., in the form of a lookup table, that contains information about the amount and type of thickness modification to be performed for each type of substrate.

The modification station 102 can also include a monitoring system 304 that provides in-situ measurement or in-line measurement of the thickness modification. In some implementations, the monitoring system 304 is similar to the monitoring system 160 of the bulk polishing apparatus 104.

For example, the monitoring system 304 can be an optical monitoring system. An optical fiber of the monitoring system 304 can project through an aperture in the polishing pad 306, be positioned between two pad sections, or be positioned to scan a portion of the substrate that is not in contact with the polishing pad. The optical fiber can project light onto the substrate and receive a reflection of light from the substrate.

The monitoring system can communicate with the controller 302 to provide feedback to and control the modification process. In situations where the modification is performed before or during the bulk polishing process of the substrate 10, the modification may not need to be precise. The thickness modification not only changes the thickness of the substrate 10, but also changes the polishing dynamics of the bulk polishing process implemented after the modification. The bulk polishing process can reach a uniform in-wafer polishing.

The modification station 102 can additionally include a polishing pad conditioning system 309 for conditioning the polishing pad 306. In some implementations, the modification station 102 includes multiple fine control polishing heads 300 for modifying multiple substrates on the same support mechanism 106 or different support mechanisms simultaneously. Sometimes while some substrates are being polished, other polishing pads are being conditioned.

Modifying the Substrate Thickness Profile

Figure 2:
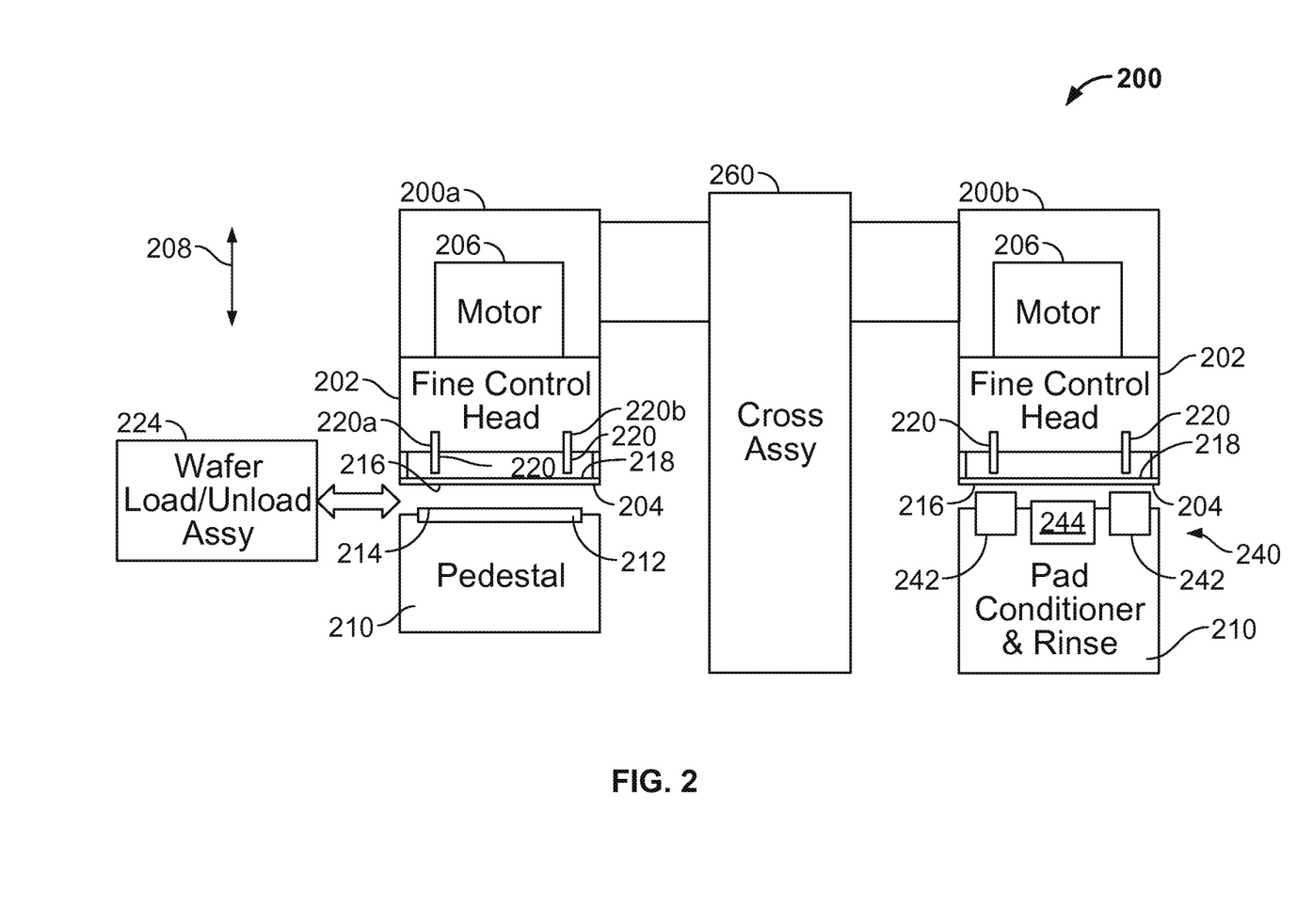
FIG. 2 illustrates a block diagram of an example of a modification station.

Referring to FIG. 2, an example modification station 200 includes a fine control polishing head 202 onto which a polishing pad 204 is attached. A pedestal 210 holds a substrate 212 to be polished by the polishing pad 204. The substrate 212 can be loaded from a bulk polishing system using a wafer load/unload assembly 224. The substrate 212 can loaded from other fabrication tools. The substrate can be loaded before, during, or after bulk polishing is performed. The pedestal 210 can move the substrate 212 up and down along a vertical direction as shown by arrows 208. For example, the pedestal 210 can bring an upper surface 214 of the substrate into contact with a polishing surface 216 of the polishing pad 204 to polish the upper surface 214. Additionally, during polishing, the pedestal 210 can optionally exert an upward force to apply a backside pressure to the polishing interface between the surfaces 214, 216. Additionally, the pedestal can contain and dispense a slurry to the polishing interface between the surfaces 214, 216.

The modification station 200 can include a motor 206 for moving the head 202 and the polishing pad 204 vertically up and down as shown by the arrows 208.

The modification station 200 can also include motors for generating relative motion between the substrate and the polishing pad during polishing. For example, the modification station can include a motor for rotating or oscillating the head 202 and the polishing pad 204. Alternatively or in addition, the motor can rotate or oscillate the pedestal 210 to provide the relative motion. The rotation or oscillation of the polishing pad relative to the substrate 212 polishes the surface 214 of the substrate. During polishing, the downward force applied by the fine control polishing head 202 produces a front-side pressure to the polishing interface between the surfaces 214, 216.

The fine control polishing head 202 is configured to hold the polishing pad 204. The polishing pad can be sufficiently wide to span the entire width of the substrate. A back surface 218 of the polishing pad 204 (i.e., the side opposite to the polishing surface 216) can be secured to the fine control polishing head 202 by adhesive, or held on the head 202 by one or more clamps. In some implementations, only the rim of the polishing pad 204 is secured to the fine control polishing head 202. In this case, the remainder of the back surface 218 (except for regions contacted by the control pads discussed below) can be exposed to a fluid, e.g., air, in an interior chamber between the polishing pad 204 and the head 202. The interior chamber in the head 202 can be vented to atmosphere.

The fine control polishing head 202 includes or more pressure applicators 220 for exerting localized force on the surface 218 of the polishing pad 204. Each pressure applicator includes an actuator and a body that is controllably mechanically actuated to move into contact and apply pressure to the surface 218 of the polishing pad 204. Thus, the polishing pad 204 is located between the pressure applicators 220 and the substrate 212. The actuator can be a linear actuator, and can be configured to move the body in a direction perpendicular to the back surface 218 of the polishing pad 204 when attached to the head 202.

The body of the pressure applicator 220 that moves into contract with the surface 218 of the polishing pad 204 can be referred to as a "pressure control pad," although the pressure control pad need not be a soft or thin body. In the example shown in FIG. 2, the head 202 includes two pressure control pads 220a, 220b, although other numbers of pressure control pads can be used. For example, rather than two pads 221, 220b, there can be a single annular control pad. Generally, the polishing pad 204 is softer than the substrate 212 and the front-side pressure applied by the pressure control pads passes through the polishing pad without significantly dispersing the pressure. As a result, the pressure received on the substrate surface 214 is substantially limited to the size of the contact area between the pressure control pad 220 and the surface 218.

By choosing the size and shape of the contact area or the cross-section of the pressure control pad 220, the size and shape of the area on the substrate surface 214 to be polished can be fine-tuned. In some implementations, the size of the contact area or the cross-section of the pressure control pad 220 is chosen based on the desired resolution of the smoothness on the surface 214. For example, if the desired smoothness of the surface 214 is up to the 10 mm, then any localized peaks or valleys that has a size of 10 mm or more needs to be finely polished away. The pressure control pad 220 can be chosen to have the size in the same magnitude as the localized peak. Thus, localized pressure can be applied to such peaks to smooth them.

Figure 5A:
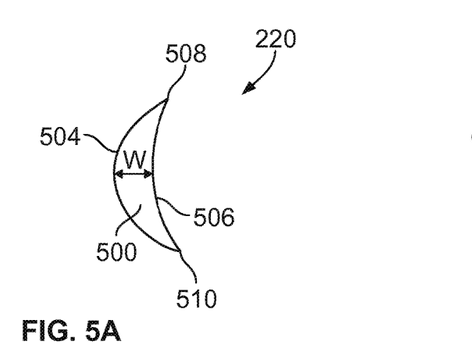
FIGS. 5A and 5B illustrate schematic cross-sectional views of pressure control pads.
Figure 5B:
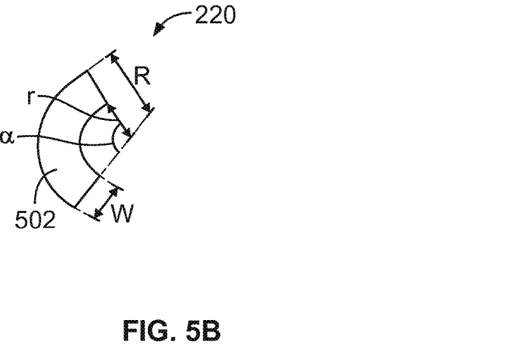

Some examples of suitable shapes for the cross-section of a pressure control pad 220 are shown in FIGS. 5A and 5B. In particular, FIG. 5A shows a horizontal cross-section 500 having an arc shape, which corresponds to the contact area between the pressure control pad 220 and the polishing pad surface 218 (see, FIG. 2). The arc shape of the cross-section 500 has an outer perimeter 504 and an inner perimeter 506 having different curvatures and meeting at two ends 508, 510. Each perimeter 504, 506 can be part of a cylinder or other structure. At a widest part of the arc, the perimeters 504, 506 are separated by a width w of about, e.g., 1 mm to 10 mm, 1 mm to 5 mm, or 3 mm.

FIG. 5B shows another cross-section 502 also having an arc shape. The pressure control pad 220 having the cross-section 502 can be made as part of a hollow cylinder.

The outer radius R of the cylinder can be chosen based on the size of the substrate, e.g., about 130 mm to about 150 mm, about 140 mm to about 150 mm, or about 145 mm. A width w of the cylinder can be, e.g., about 1 mm to 10 mm, about 1 mm to about, 5 mm, or about 3 mm. The arc of FIG. 5B can correspond to an angle α of about 10 degrees to about 60 degrees from the center of the cylinder.

For a fine control polishing head 202 of FIG. 2, multiple pressure control pads having different sizes and shapes can be prepared for use with different imperfections and different substrates. Before use, one or more pressure control pads having suitable shapes and sizes, e.g., corresponding to the smallest size of the imperfections intended to be removed, can be chosen and mounted onto the fine polishing control head 202 for use.

The pressure control pads can be moved to locations at which localized pressure is desirable for localized polishing of the substrate. In some implementations, the pressure control pads have a fixed lateral position in the fine control polishing head 202, so it is the fine control polishing head that needs to be moved to position the pressure control pads in the desired region. In some implementations, the pressure control pads have are movable within the fine control polishing head 202, e.g., by linear actuators within the head 202. For example, each pressure control pad can be moved independently of the other pressure control pads.

In some implementations, two pressure control pads form a pair and are positioned in coordination. For example, the two pressure control pads 220a, 220b can be arranged along a diameter of the substrate 212 or a diameter of the polishing pad 204 and move along the diameter to be relatively closer or farther to each other. In some implementations, the control pads 220a, 22b can remain equidistant from a center point of the substrate 212 or polishing pad 204 as they move along the diameter. In some implementations, the fine control polishing head 202 rotates, and the pair of pads are equidistant from the axis of rotation.

During the polishing operation, the pressure control pads can be held stationary relative to the fine control polishing head 202, but move with the fine control polishing head 202.

Figure 3:
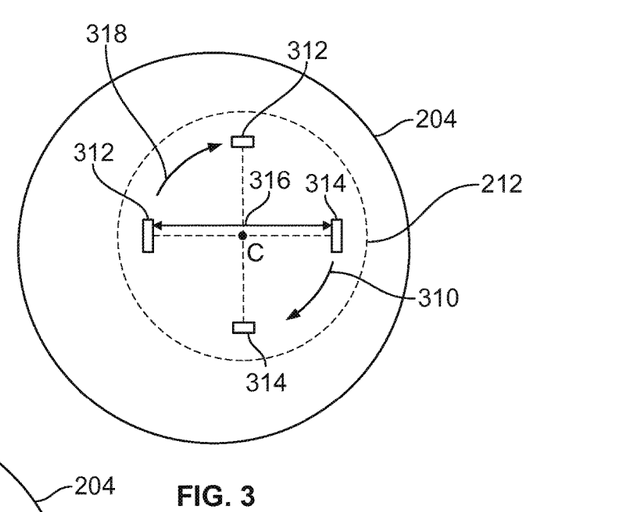
FIGS. 3 and 4 illustrate schematic top views of parts of modification stations.

An example of a pair of coordinated pressure control pads 312, 314 is shown in FIG. 3. In this example, each pair of pressure control pads 312, 314 is located along a diameter of the substrate 212 on opposite sides of a center C of the substrate. The pressure control pads 312, 314 can be connected to the same moving mechanism, e.g., a step motor, a linear actuator, or a pneumatic cylinder, and can move along the directions shown by arrows 316 simultaneously by the same amount relative to the center C. In some implementations, the pair of pressure control pads can be coordinately moved to different locations that correspond to a different diameter of the substrate 212, as shown by the arrows 318, 310. At the different diameter, the pressure control pads 312, 314 can again be moved along the different diameter.

During polishing, as described previously, the fine control polishing head 202 and the polishing pad 204 may rotate relative to the substrate 204. As a result, the pressure control pads 220 also rotate relative to the substrate 204. The localized polishing by the localized pressure applied from the polishing pads 220 can occur along an entire radial circle. In some implementations, instead of rotating the polishing head 202 and the polishing pad 204, the motor 206 vibrates the polishing pad to remove materials from the substrate surface 214 at the locations corresponding to the pressure control pads 220. At a later time, the pressure control pads 220 may be moved to a different location to remove materials from that different location. The locations of the pressure control pads can be predetermined based on the desired and actual thickness profiles of the substrate.

Figure 4:
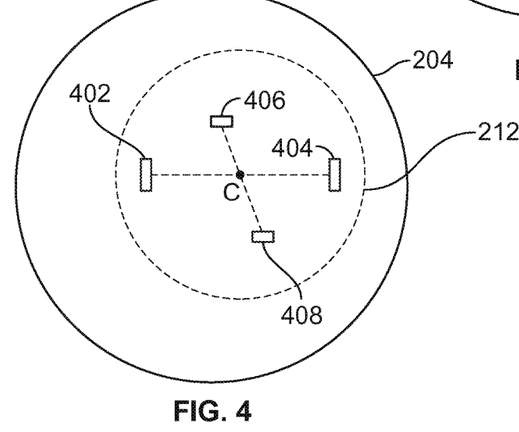

In some implementations, the fine control polishing head 202 of FIG. 2 can include multiple pairs of pressure control pads arranged along different diameters and having separated by different distances. For example, FIG. 4 shows two pairs of pressure control pads 402, 404 arranged along one diameter of the substrate 212 and 406, 408 arranged along a different diameter of the substrate 212. Each pair of pressure control pads can have features similar to those of the pressure control pads 302, 304 of FIG. 3. The pads 406, 408 are closer to each other than the pads 402, 404. When the polishing pad 204 rotates relative to the substrate 212, the two pairs of pressure control pads polishes two circular regions having different radii relative to the center C. When the polishing pad 204 vibrates, the two pairs of pressure control pads polishes four different locations of the substrate surface 214 simultaneously and efficiently.

In some implementations, the fine control polishing head 202 of FIG. 2 includes multiple independent pressure control pads. Each independent pressure control pad can be independently controlled as to its location relative to the substrate 212, e.g., the center C of the substrate 212, the pressure to be applied to the polishing pad surface 218, and the length of time for which the pressure is applied.

In some situation, instead of being stationary relative to the polishing pad 204, the pressure control pad(s) or pair(s) of pressure control pads can move, e.g., sweep along a path, relative to the polishing pad during polishing.

In some implementations, depending on the amount of localized polishing needed to achieve the desired thickness and smoothness profile, at different locations of the substrate, different amount of pressure and/or different length of polishing time can be applied by independent pressure control pads or independent pairs of pressure control pads. For example, sometimes bulk polishing of a substrate causes the substrate to have a so-called asymmetry problem, in which the thickness variation is larger near an edge of a bulk polished substrate than in a central region of the substrate. The thickness modifications at the center region and the edge region of the substrate can be performed differently to achieve a uniform thickness within the substrate surface 214.

In some implementations, different from those shown in FIGS. 3 and 4, the size of the polishing pad 212 is chosen to be similar to the size of an area that needs localized polishing and smaller than the size of the substrate 212. For example, the polishing pad 212 can have a diameter of about 120 mm to about 150 mm. A fine polishing control head like the head 202 can have multiple polishing pads having different sizes. In use, a suitable polishing pad can be chosen and be moved from one location to another location on the substrate surface 214 to locally remove materials at those locations. The small size of the polishing pad 212 can further reduce possible dispersion of the front-side pressure applied by the pressure control pad(s). The polishing can be applied within the chosen region without affecting other regions.

Figure 6:
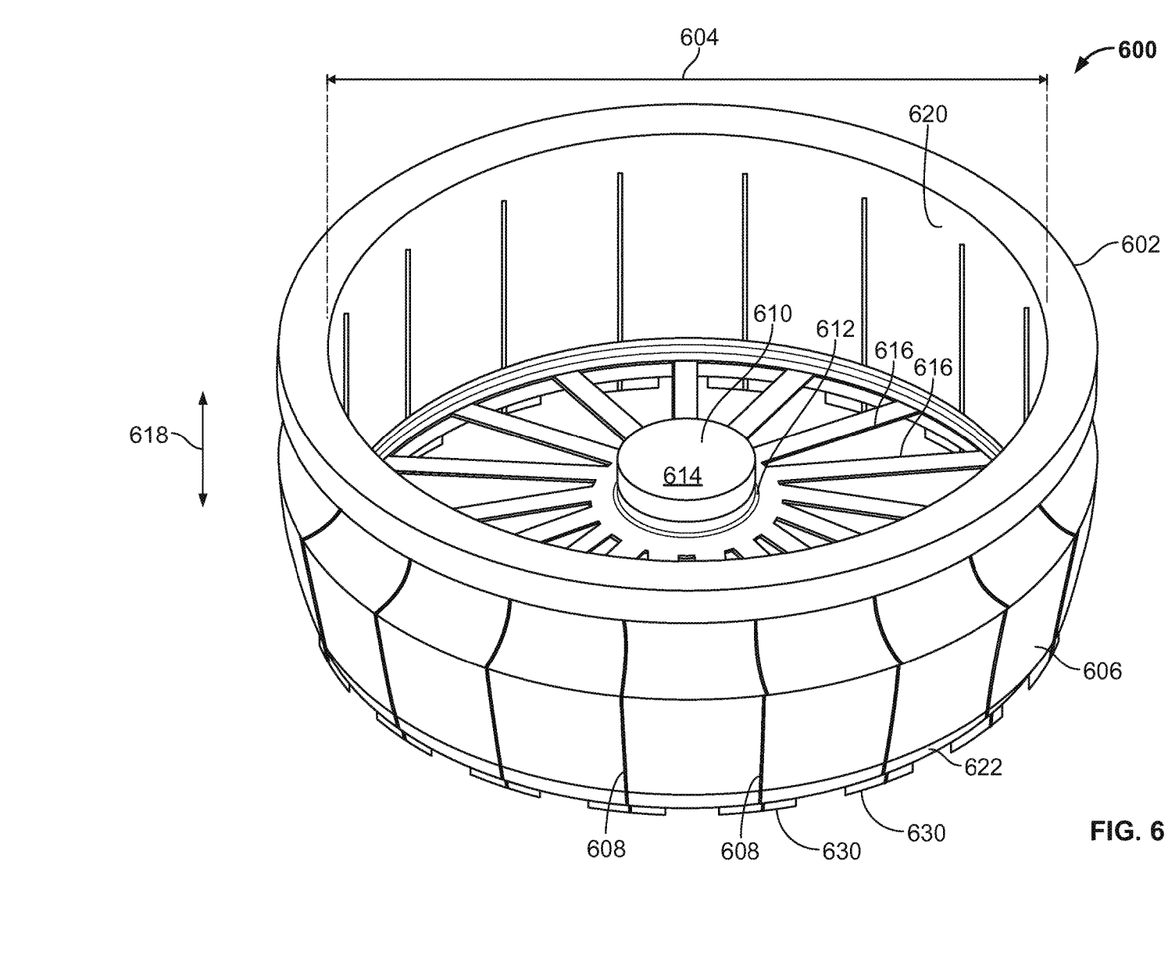
FIG. 6 is a schematic perspective view of an example of a flexible ring.
Figure 6A:
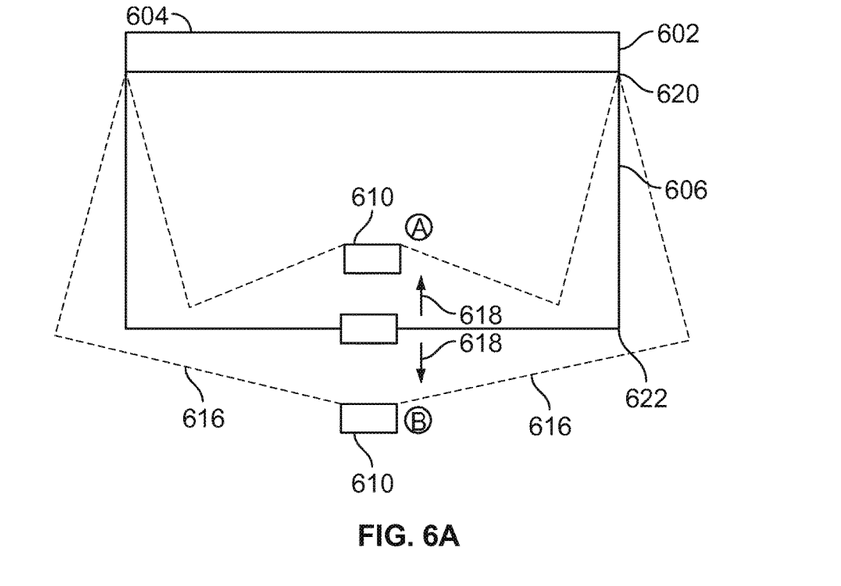
FIG. 6A is a schematic cross-sectional view of a flexible ring.

Referring to FIGS. 6 and 6A, alternative to or in addition to the pressure control pads 220 described above, the pressure applicator can include a flexible ring 600 that is used to apply localized front-side pressure to the polishing pad surface 218. The flexible ring 600 includes an upper outer ring 602 having a fixed upper radius 604, and a flexible body 606 connected to the upper outer ring 602. The flexible body 606 and the upper outer ring 602 can be formed integrally. The flexible body includes slots 608 extending from the upper outer ring 602 to the bottom of the flexible body 606, such that the top 620 of the flexible body at which the flexible body 606 connects to the upper outer ring 602 has a fixed radius that is the same as the radius 604, and the bottom 622 of the flexible body 606 can shrink or expand by increasing or decreasing the size of the slots 608 at the bottom 622.

The flexible ring 600 also includes a central hub 610 including a moving mechanism 614 and a ring 612 connected to the moving mechanism. The central hub 610 is connected to the bottom 622 of the flexible body 606 by ribs 616 extending from the ring 612. The moving mechanism 614, which can be a motor, a linear actuator, or an air cylinder, can move up and down along a direction 618 that is vertical to the surface of the upper outer ring and parallel to a long axis of the body 606. The ribs 616 can be flexible such that, as the central hub 610 moves upward towards the upper outer ring 602, the ribs 616 pull the body 606 inwards such that the diameter of the bottom 622 is reduced, e.g., at position A. As the central hub 610 moves downwards away from the upper outer ring 602, the ribs push the body 606 outwards such that the diameter of the bottom 622 is increased, e.g., at position B.

As a result, the flexible ring 600 can replace the pressure control pads 220 of FIG. 2, and the bottom 622 of the flexible ring 600 can contact the polishing pad surface 218 to create localized pressure at desired radial locations of the substrate 212. At least radial location, the localized pressure can distribute uniformly along the corresponding circle. The radial range of the bottom 622 can be chosen based on the need of the substrate 212. For example, the radial range can be about 140 mm to about 150 mm. To create the desired radial range, one or more factors, including dimensions and materials of the ribs 616, the dimensions and materials of the upper outer ring 602 and the body 606, the motor movement ranges, and/or the size of the slots, can be considered. As an example, suitable materials for the upper outer ring 602, the body 606, and the ribs 616 include plastic materials that have good flex fatigue. Examples of materials for the ribs include Nylon, polyphenylene sulfide (PPS), polyetheretherketone (PEEK) and polyethylene terephthalate (PET). The bottom 622 can have a width similar to the width of the pressure control pads 220, e.g., about 1 mm to about 10 mm, about 1 to 5 mm, or about 3 mm.

In some implementations, the bottom 622 of the body 606 additionally includes discrete features 630 for direct contact with the polishing pad surface 218. The features 630 can have desired shapes and sizes, e.g., similar to those of the pressure control pads 220. In some implementations, different features at different locations of the bottom 622 can have the same or different shapes and/or sizes. The features may be permanently attached to or integrally formed with the body 606, or can be detachable so that a user may choose the locations at which the pressure is to be applied on the substrate 212.

In some implementations, the modification station 200 of FIG. 2 can include more than one flexible ring 600. Each flexible ring can be configured to apply localized pressure to a selected radial range and different flexible rings can correspond to different radial ranges. The modification station 200 can also include a combination of the flexible ring(s) 600 and the pressure control pads 220.

Figure 7:
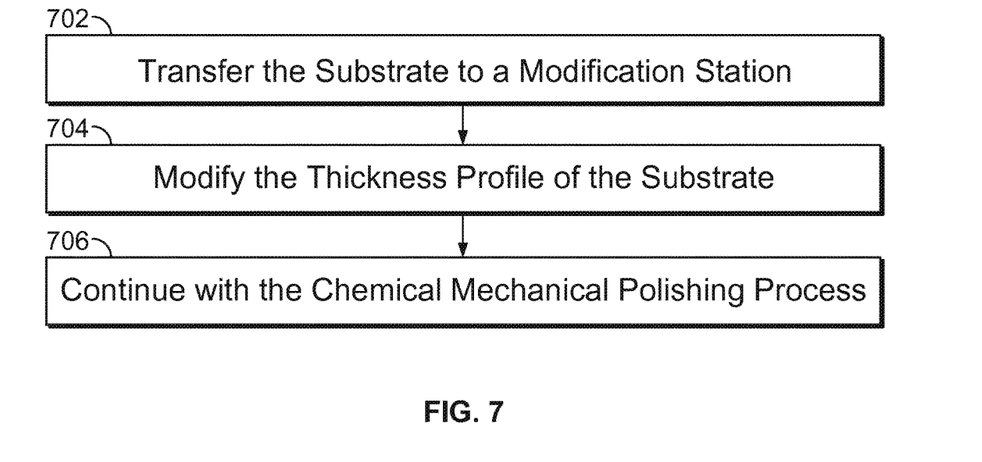
FIG. 7 is a flow diagram of an example process for modifying a thickness profile of a substrate.

Referring to FIG. 7, an example process 700 for use in modifying a thickness profile of a substrate to be, being, or that has been chemical mechanically bulk polished is shown. Initially, before, during, or after the substrate is bulk polished, when it is determined that the thickness profile of the substrate needs to be modified, the substrate is transferred (702) to a modification station. During or after the substrate is polished, the substrate can be transferred from a polishing head of a bulk polishing apparatus. Before the substrate is polished, the substrate can be transferred from another processing station that has processed the substrate to be polished. The thickness profile of the substrate is then chemical mechanically modified (704). In particular, the modification can be performed to one or more localized regions of the substrate surface. The modification profile, e.g., the amount of material(s) to be removed, the location of the removal, etc., can be looked up in data stored for different types of substrates and polishing systems, or can be determined in-situ. The modification can be monitored in-situ or off-line to determine whether a desired thickness profile has been reached. Sometimes, e.g., when the modified substrate is to be polished or further polished, the modification does not have to be accurate, e.g., up to nanometers, but only needs to be accurate up to 10 nanometers or larger. Finally, the substrate is transferred to continue (706) with the chemical mechanical polishing process. In situations where the modification is performed after the substrate is fully polished, the entire process ends.

Polishing Pad Conditioning System

Referring again to FIG. 2, the modification station 200 can additionally include a polishing pad conditioning system 240, which can abrade the polishing pad surface 216 to maintain the polishing pad 204 in a consistent abrasive state and remove debris from the pad surface 216. The conditioning system 240 includes pad conditioning head(s) 242 for resurfacing the pad surface 216, and a rinse assembly 244 for delivering water and/or chemicals to the polishing pad surface 216 to help with the conditioning. For example, the water and/or chemicals can rinse the pad surface 216 and carry away debris from the pad surface 216. The conditioning system 240 can be separate from the modification station 200 and the polishing pad 204 can be move to the system 240 and conditioned between substrate modification processes.

In the example shown in FIG. 2, the conditioning system 240 is integrated in the modification station 200. The conditioning head(s) 242 and the rinse assembly 244 can be stored within an open chamber of the pedestal 210 before and during a modification process is applied to the substrate 212. After the substrate 212 completes its thickness modification, the conditioning head(s) 242 and the rinse assembly 244 can be raised to be exposed to and/or in contact with the polishing pad surface 216. Alternatively, the conditioning head(s) 242 can be placed laterally in a direction perpendicular to the directions 208 at a radius larger than the polishing pad 204 and the substrate 212. During the modification process, the conditioning head(s) 242 does not contact the substrate 212 or the polishing pad 204. After the modification process is completed, the conditioning head(s) 242 can be moved laterally to be under the polishing surface 216 to condition the polishing surface 216.

Sometimes because the polishing pad surface 216 is used only in selected locations in a modification process, the conditioning head(s) 242 can be adjusted laterally to those selected locations of the polishing pad surface 216. Conditioning is then performed at these selected locations, instead of the entire pad surface 216. As described previously, the polishing pad surface 216 may have a small size to cover a localized area of the substrate that needs thickness modification. In such a situation, the entire polishing pad surface 216 can be conditioned. A description of a conditioner head for use in a conditioning system, such as conditioner head(s) 242 of the system 240, can be found in U.S. Pat. No. 6,036,583, the entire content of which is incorporated herein by reference.

In some implementations, the system includes multiple stations. In the example shown in FIG. 2, the system 200 includes a modification station 200*a* and a conditioning station 200*b*. The modification station 200*a* includes the substrate support 210. The conditioning station 200*b* includes the conditioning system 240. The polishing carrier 202 can be suspended from a movable support, e.g., a rotatable carousel, configured to transport the carrier 202 between the modification station 200*a* and the conditioning station 200*b*. The stations of the system can be spaced at equal angular intervals around the axis of rotation of the carousel.

In some implementations, the modification station 200 includes multiple modification stations that have the same feature as the modification station described above with respect to FIG. 2.

The carousel 260 can coordinate the processes performed by the stations 200*a*, 200*b* to produce polishing pads with a high throughput. For example, when the sub-modification station 200*a* is modifying the thickness profile of the substrate 212, the sub-modification station 200*b* conditions the polishing pad 204.

As used in the instant specification, the term substrate can include, for example, a product substrate (e.g., which includes multiple memory or processor dies), a test substrate, a bare substrate, and a gating substrate. The substrate can be at various stages of integrated circuit fabrication, e.g., the substrate can be a bare wafer, or it can include one or more deposited and/or patterned layers. The term substrate can include circular disks and rectangular sheets.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Although the description above has focused on control of a chemical mechanical polishing system, the modification station can be applicable to other types of substrate processing systems, e.g., etching or deposition systems.

Control of the various systems and processes described in this specification, or portions of them, can be implemented in a computer program product that includes instructions that are stored on one or more non-transitory machine-readable storage media, and that are executable on one or more processing devices. The systems described in this specification, or portions of them, can be implemented as an apparatus, method, or electronic system that may include one or more processing devices and memory to store executable instructions to perform the operations described in this specification.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A polishing system, comprising:
    a support to hold a substrate having a substrate surface to be polished;
    a carrier to hold a polishing surface of polishing pad in contact with the substrate surface; and
    a pressure applicator to apply pressure at a selected region of a back surface of the polishing pad, the back surface being opposite to the polishing surface, wherein the pressure applicator includes a first actuator, a second actuator, and a body configured to be moved by the first actuator into and out of contact with the selected region of the back surface of the polishing pad and to be moved by the second actuator laterally relative to the carrier.

2. The polishing system of claim 1, wherein the pressure applicator comprises one or more pressure control pads each having a cross-sectional area to contact the back surface of the polishing pad, and wherein each cross-sectional area has a lateral dimension of about 1 mm to about 10 mm.

3. The polishing system of claim 2, wherein each cross-section area has a shape of an arc.

4. The polishing system of claim 1, wherein the pressure applicator comprises a plurality of pressure control pads that are laterally movable relative to the polishing pad.

5. The polishing system of claim 4, wherein each pressure control pad is laterally moveable independently of other pressure control pads.

6. The polishing system of claim 4, each pressure control pad is laterally movable relative to a position of a center of the substrate surface when the substrate is held by the substrate support.

7. The polishing system of claim 6, wherein the plurality of pressure control pads comprise a pair of pressure control pads that are movable in coordination relative to the center of the substrate surface.

8. The polishing system of claim 1, comprising a drive system to generate relative motion between the substrate and the polishing pad.

9. The polishing system of claim 1, wherein the pressure applicator comprises a flexible ring having a top structure and a bottom structure, the top structure having a fixed diameter, and the bottom structure having a cross-section for contacting the back surface of the polishing pad and having an adjustable diameter.

10. The polishing system of claim 9, wherein the flexible ring further comprises ribs and a moving mechanism, each rib having one end connected to the moving mechanism and another end connected to a bottom of the body at a location between adjacent slots of the body, wherein the moving mechanism is configured to move along a long axis of the body to adjust the diameter of the body at the bottom.

11. The system of claim 1, further comprising a conditioning system for conditioning the polishing surface of the polishing pad, the conditioning system comprising one or more conditioning heads configured to move to and condition one or more regions of the polishing surface that correspond to the selected region of the back surface.

12. A polishing tool, comprising:
    a bulk polishing station, comprising
        a rotatable platen to support a polishing article, and
        a carrier head to hold a substrate with a substrate surface of the substrate in contact with a polishing surface of the polishing article, the carrier head having one or more controllable zones;
    a modification station, comprising
        a support to hold the substrate,
        a carrier to hold a polishing surface of a polishing pad in contact with the substrate surface, and
        a pressure applicator to apply pressure at a selected region of a back surface of the polishing pad, the back surface being opposite to the polishing surface, wherein the pressure applicator includes an actuator and a body configured to be moved by the actuator into and out of contact with the selected region of the back surface of the polishing pad; and
    a transfer mechanism configured to transfer the substrate between the bulk polishing station and the modification station.

* * * * *